US012772677B2

(12) United States Patent
Park

(10) Patent No.: US 12,772,677 B2
(45) Date of Patent: Oct. 20, 2026

(54) DISPLAY DEVICE

(71) Applicant: Samsung Display Co., Ltd., Yongin-si (KR)

(72) Inventor: Kyungjun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 578 days.

(21) Appl. No.: 17/738,443

(22) Filed: May 6, 2022

(65) Prior Publication Data

US 2023/0038559 A1 Feb. 9, 2023

(30) Foreign Application Priority Data

Aug. 5, 2021 (KR) ........................ 10-2021-0103433

(51) Int. Cl.

*H10K 59/131* (2023.01)
*H10K 77/10* (2023.01)
*H10K 102/00* (2023.01)
*H10W 42/00* (2026.01)

(52) U.S. Cl.

CPC ......... *H10K 59/131* (2023.02); *H10K 77/111* (2023.02); *H10W 42/121* (2026.01); *H10K 2102/311* (2023.02)

(58) Field of Classification Search

CPC ......... H10K 77/111; G06F 2203/04102; G06F 1/1652; H05K 3/4691

See application file for complete search history.

(56) References Cited

U.S. PATENT DOCUMENTS

| | | | | |
|---|---|---|---|---|
| 9,229,566 | B2 | 1/2016 | Kang | |
| 2009/0284946 | A1 | 11/2009 | Yang et al. | |
| 2018/0090696 | A1* | 3/2018 | Jang | H10K 77/10 |
| 2018/0350701 | A1 | 12/2018 | Park et al. | |
| 2019/0305234 | A1* | 10/2019 | Jung | H10K 71/00 |
| 2020/0006681 | A1* | 1/2020 | Kim | H01L 27/1259 |
| 2020/0185641 | A1* | 6/2020 | Jeong | H10K 59/8791 |
| 2020/0192433 | A1 | 6/2020 | Shin et al. | |

(Continued)

FOREIGN PATENT DOCUMENTS

| | | | | | |
|---|---|---|---|---|---|
| CN | 109148534 | A | * | 1/2019 | G09F 9/301 |
| CN | 111534240 | A | * | 8/2020 | B32B 1/00 |

(Continued)

OTHER PUBLICATIONS

Nematollahisarvestani, Ali & Lee, Y.C . . . (2020). A Review on United States Patents to Prevent Mechanical Failures in Foldable Smartphones. Journal of Electronic Packaging. 143. 10.1115/1.4048011. (Year: 2020).*

*Primary Examiner* — Alia Sabur
(74) *Attorney, Agent, or Firm* — Sughrue Mion, PLLC

(57) ABSTRACT

A display device includes: a substrate including a first area, a second area, and a bending area between the first area and the second area; a display layer disposed on the first area of the substrate; a display driving unit disposed on the second area of the substrate; and a cover member including a first surface and a second surface and extending to cover a portion of the second area of the substrate, the bending area of the substrate, and a portion of the first area of the substrate, the cover member including a separation area in which the cover member is partially separated on the first surface opposite to the second surface facing the substrate.

20 Claims, 9 Drawing Sheets

(56) References Cited

U.S. PATENT DOCUMENTS

| | | | | |
|---|---|---|---|---|
| 2021/0165447 | A1* | 6/2021 | Wang | G06F 1/1616 |
| 2022/0035411 | A1 | 2/2022 | Uogishi et al. | |

FOREIGN PATENT DOCUMENTS

| | | | |
|---|---|---|---|
| JP | 2020-177079 | A | 10/2020 |
| KR | 10-1340296 | | 12/2013 |
| KR | 10-2018-0033364 | A | 4/2016 |
| KR | 10-2018-0131120 | A | 12/2018 |
| KR | 10-2019-0115548 | | 10/2019 |
| KR | 10-2020-0073085 | | 6/2020 |
| KR | 10-2136392 | | 7/2020 |

* cited by examiner

DISPLAY DEVICE

CROSS-REFERENCE TO RELATED APPLICATION

This application claims priority from and the benefit of Korean Patent Application No. 10-2021-0103433, filed on Aug. 5, 2021, which is hereby incorporated by reference for all purposes as if fully set forth herein.

BACKGROUND

Field

Embodiments of the invention relate generally to display devices, and more particularly, to display devices including cover members.

Discussion of the Background

Recently, electronic apparatuses are widely used in various fields. The electronic apparatuses may include mobile electronic apparatuses and stationary electronic apparatuses. To implement various functions, the electronic apparatuses may include display devices for providing users with visual information such as images or videos.

Recently, as the sizes of elements/parts for driving a display device decrease, a space (or an area) for the display device in an electronic apparatus has gradually increased, and the display device has been developed to be bent by a certain angle from a flat state.

Generally, a display device has a display layer located on a substrate. In such a display device, by bending at least a portion of the display device, visibility of the display device may be improved at various view angles, and the size of a non-display area of the display device may be reduced.

The above information disclosed in this Background section is only for understanding of the background of the inventive concepts, and, therefore, it may contain information that does not constitute prior art.

SUMMARY

Applicants discovered that in a bending process for bending at least the portion of the display device, a substrate of the display device is not easily bent, and is not maintained at a designed curvature.

Display devices constructed according to the principles of the invention are capable of protecting substrates and maintaining curvatures of the substrates by providing cover members having separation areas.

Additional features of the inventive concepts will be set forth in the description which follows, and in part will be apparent from the description, or may be learned by practice of the inventive concepts.

According to an aspect of the invention, a display device includes a substrate including a first area, a second area, and a bending area between the first area and the second area, a display layer disposed on the first area of the substrate, a display driving unit disposed on the second area of the substrate, and a cover member including a first surface and a second surface and extending to cover a portion of the second area of the substrate, the bending area of the substrate, and a portion of the first area of the substrate, the cover member including a separation area in which the cover member is partially separated on the first surface opposite to the second surface facing the substrate.

The separation area may be disposed at a position where a curvature of the bending area ends.

The separation area may include a plurality of separation areas disposed along a curved surface of the bending area from the first area to the second area.

The separation area may be substantially parallel to the first area of the substrate and symmetrically with respect to a plane passing through a bending axis of the bending area of the substrate.

The separation area may include a groove.

A center line of the groove may be substantially parallel to a line substantially perpendicular to the first area or the second area.

The separation area may include a plurality of uneven portions disposed at a position where a curvature of the bending area ends.

The separation area may include a cut portion.

The cut portion may be obtained by cutting half or more of a thickness of the cover member.

The cover member may cover the display driving unit.

The cover member may include copper.

A thickness of the cover member may be less than a distance between one surface of the cover window covering the first area and one surface of the first area facing the one surface of the cover window.

The cover member may be spaced apart from the display layer.

A width of the cover member is same as a width of the bending area.

A length of a first portion of the cover member covering the first area from the bending area may be shorter than a length of a second portion of the cover member covering the second area from the bending area.

According to another aspect of the invention, a display device includes a substrate including a first area, a second area, and a bending area between the first area and the second area, a display layer disposed on the first area of the substrate, a display driving unit disposed on the second area of the substrate, and a cover member extending to cover a portion of the second area of the substrate, the bending area of the substrate, and a portion of the first area of the substrate, the cover member including a folding area having a thickness less than a thickness of a main portion of the cover member.

The folding area may be disposed at a position where a curvature of the bending area ends.

The folding area may include a plurality of folding areas disposed along a curved surface of the bending area from the first area to the second area.

The folding area may include a cut portion.

The cut portion may be formed by cutting half or more of a thickness of the cover member.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
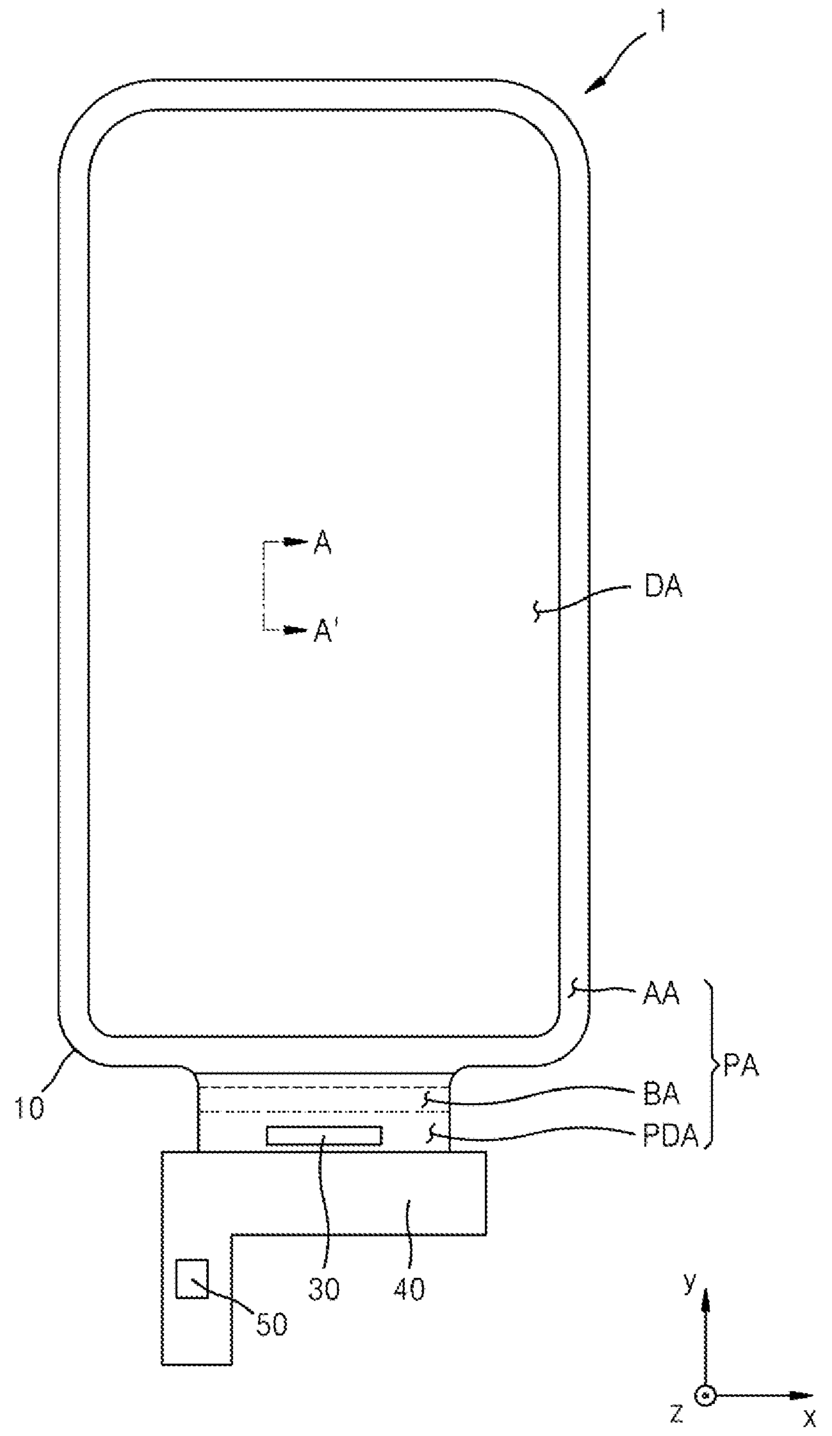
FIG. 1 is a schematic plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
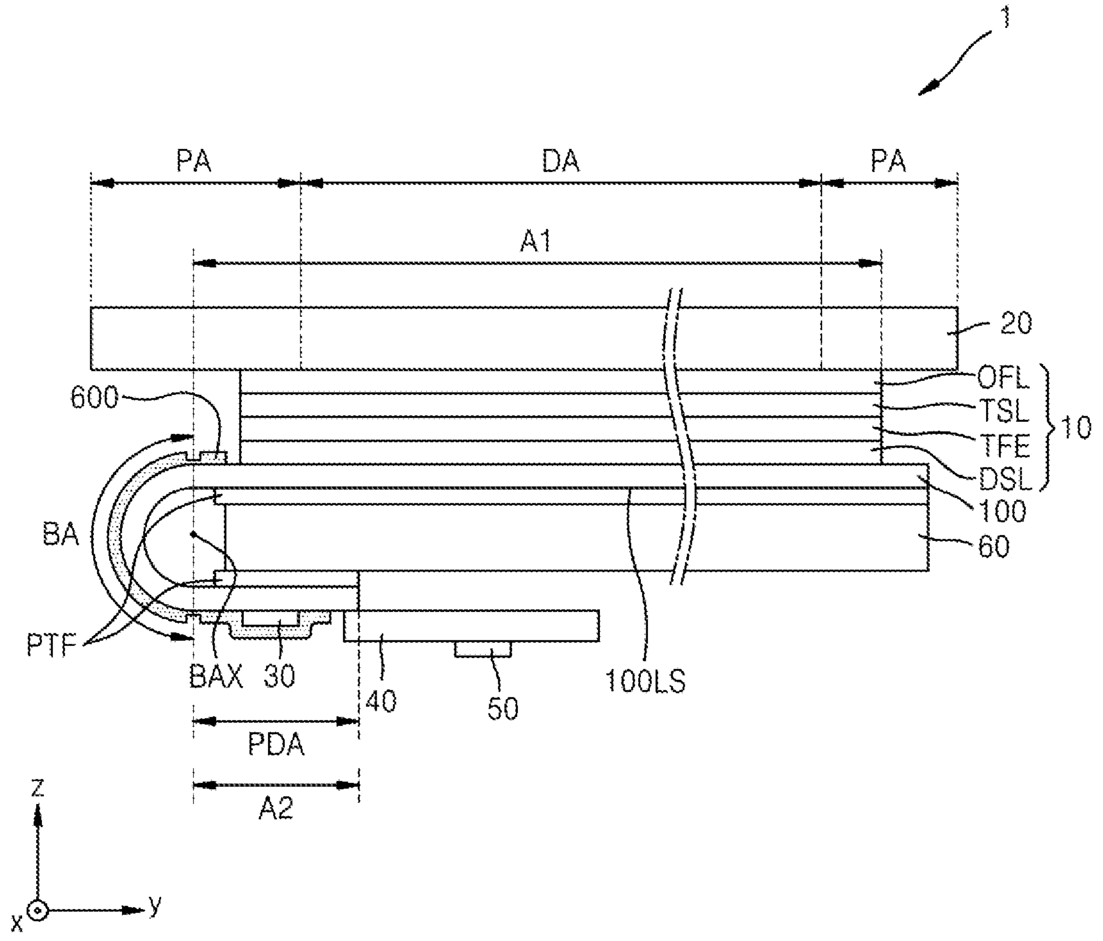
FIG. 2 is a cross-sectional view of the display device of FIG. 1 illustrating constituent elements thereof.

FIG. 1 is a schematic plan view showing a portion of a display device 1 according to an embodiment. FIG. 2 is a cross-sectional view of the display device 1 of FIG. 1 including constituent elements. In FIG. 2, as a substrate 100 is a flexible substrate, a display panel 10 is illustrated as having a bent shape in a bending area BA. FIG. 1 illustrates, for descriptive convenience, a state in which the display panel 10 is not bent.

Referring to FIG. 1, the display device 1, as a device for displaying a video or a still image, may be used as a display screen not only for portable electronic apparatuses such as mobile phones, smart phones, tablet personal computers (PCs), mobile communication terminals, electronic organizers, electronic books, portable multimedia players (PMPs), navigation devices, ultra mobile PCs (UMPCs), and the like, but also for various products such as televisions, notebooks, monitors, billboards, Internet of things (JOT), and the like. Furthermore, the display device 1 according to an embodiment may be used for wearable devices such as smart watches, watch phones, glasses type displays, and head mounted displays (HMDs). Furthermore, the display device 1 according to an embodiment may be used as a display for an instrument panel for vehicles, a center information display (CID) arranged on the center fascia or dashboard of vehicles, a room mirror display in lieu of a side mirror of vehicles, or a display arranged at the rear side of a front seat as an entertainment for a rear seat of vehicles.

The display device 1 may have an approximately rectangular shape, as illustrated in FIG. 1. For example, the display device 1, as illustrated in FIG. 1, has an overall rectangular flat shape having a short side extending in a first direction, for example, a positive x direction or a negative x direction, and a long side extending in a second direction, for example, a positive y direction or a negative y direction. In an embodiment, a portion where the short side extending in the first direction, for example, the positive x direction or the negative x direction, and the long side extending in the second direction, for example, the positive y direction or the negative y direction, meet may have a right angle shape or a round shape having a certain curvature. The flat shape of the display device 1 is not limited to a rectangular shape, and the display device 1 may have other shapes such as polygonal, circular, or oval.

The display device 1 may include a display area DA and a peripheral area PA. The display area DA may display an image. For example, a plurality of pixels PX may be arranged in the display area DA. The display device 1 may display an image by using light emitted from the pixels PX. Each of the pixels PX may emit light using a display element. In an embodiment, each of the pixels PX may emit red light, green light, or blue light. In an embodiment, each of the pixels PX may emit red light, green light, blue light, or white light.

The peripheral area PA may be a non-display area that does not display an image. The peripheral area PA may at least partially surround the display area DA. For example, the peripheral area PA may entirely surround the display area DA. A driving unit for providing an electrical signal to the pixels PX, a power wiring for providing power, and the like may be arranged in the peripheral area PA. For example, a scan driving unit for applying a scan signal to the pixels PX may be arranged in the peripheral area PA. Furthermore, a data driving unit for applying a data signal to the pixels PX may be arranged in the peripheral area PA.

Referring to FIG. 2, the display device 1 may include the display panel 10, a cover window 20, a display driving unit 30, a display circuit board 40, a touch sensor driving unit 50, a cushion layer 60, and a protective film PTF.

The display panel 10 may display information processed in the display device 1. For example, the display panel 10 may display execution screen information about an application executed in the display device 1 or user interface (UI) or graphic user interface (GUI) information according to the execution screen information.

The display panel 10 may include a display element. For example, the display panel 10 may include an organic light-emitting display panel using an organic light-emitting diode, a micro light-emitting diode display panel using a micro light-emitting diode (micro LED), a quantum dot light-emitting display panel using a quantum dot light-emitting diode including a quantum dot light-emitting layer, or an inorganic light-emitting display panel using an inorganic light-emitting element including an inorganic semiconductor. In the following description, a case in which the display panel 10 is an organic light-emitting display panel including an organic light-emitting diode as a display element is mainly described in detail.

The display panel 10 may include the substrate 100 and a multilayer film arranged on the substrate 100. In an embodiment, the display panel 10 may include the substrate 100, a display layer DSL, a thin film encapsulation layer TFE, a touch sensor layer TSL, and an optical functional layer OFL. For example, the display area DA and the peripheral area PA may be defined on the substrate 100 and/or the multilayer film. For example, the substrate 100 may include the display area DA and the peripheral area PA. Furthermore, the peripheral area PA may include a pad area PDA and a bending area BA.

The substrate 100 may include polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, and the like. In an embodiment, the substrate 100 may have a multilayer structure including a base layer including the above-described polymer resin and a barrier layer. The substrate 100 including polymer resin may have flexible, rollable, and bendable characteristics.

The substrate 100 may be bent in the bending area BA. In this case, at least a portion of a lower surface 100LS of the substrate 100 may face each other, and the pad area PDA of the substrate 100 may be located lower than the other portion of the substrate 100. Accordingly, the size of the peripheral area PA, e.g., in a plan view, which is recognized by a user, may be reduced. Although FIG. 2 illustrates that only the substrate 100 is bent, in another embodiment, at least a portion of the display layer DSL, at least a portion of the thin film encapsulation layer TFE, and at least a portion of the touch sensor layer TSL may also be in the bending area BA and the pad area PDA. In this case, at least a portion of the display layer DSL, at least a portion of the thin film encapsulation layer TFE, at least a portion of the touch sensor layer TSL may also be bent in the bending area BA.

The display layer DSL may be arranged on the substrate 100. The display layer DSL may include pixel circuits and display elements. For example, each of the pixel circuits may be connected to each of the display elements. Each of the pixel circuits may include a thin film transistor and a storage capacitor. Accordingly, the display layer DSL may include a plurality of display elements, a plurality of thin film transistors, and a plurality of storage capacitors. Furthermore, the display layer DSL may further include a plurality of insulating layers disposed therebetween.

The thin film encapsulation layer TFE may be arranged on the display layer DSL. The thin film encapsulation layer TFE may be arranged on the display element, and may cover the display element. In an embodiment, the thin film encapsulation layer TFE may include at least one inorganic encapsulation layer and at least one organic encapsulation layer. The at least one inorganic encapsulation layer may include one or more inorganic materials among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride ($SiO_xN_y$). The at least one organic encapsulation layer may include a polymer-based material. The polymer-based material may include acrylic resin, epoxy-based resin, polyimide, polyethylene, and the like. In an embodiment, the at least one organic encapsulation layer may include acrylate.

The touch sensor layer TSL may be arranged on the thin film encapsulation layer TFE. The touch sensor layer TSL may sense coordinates information according to an external input, for example, a touch event. The touch sensor layer TSL may include a sensor electrode and touch wirings connected to the sensor electrode. The touch sensor layer TSL may sense an external input by a self-capacitance method or a mutual capacitance method.

The touch sensor layer TSL may be formed on the thin film encapsulation layer TFE. Alternatively, the touch sensor layer TSL may be separately formed on a touch substrate, and then coupled to the thin film encapsulation layer TFE via an adhesive layer such as an optically clear adhesive. In an embodiment, the touch sensor layer TSL may be formed directly on the thin film encapsulation layer TFE. In this case, the adhesive layer may not be disposed between the touch sensor layer TSL and the thin film encapsulation layer TFE.

The optical functional layer OFL may be arranged on the touch sensor layer TSL. The optical functional layer OFL may reduce or minimize reflectivity of light (e.g., external light) input from the outside toward the display device 1, and/or improve color purity of light emitted from the display device 1. In an embodiment, the optical functional layer OFL may include a retarder and polarizer. The retarder may be of a film type or a liquid crystal coating type, and may include a λ/2 retarder and/or a λ/4 retarder. The polarizer may also be of a film type or a liquid crystal coating type. A film type polarizer may include a stretchable synthesis resin film, and a liquid crystal coating type polarizer may include liquid crystals arranged in a certain orientation. Each of the retarder and the polarizer may further include a protective film.

In another embodiment, the optical functional layer OFL may include a black matrix and color filters. The color filters may be arranged according to the color of light emitted from each of the pixels of the display device 1. Each of the color filters may include red pigment, green pigment, or blue pigment or dye. Alternatively, each of the color filters may further include a quantum dot in addition to the above-described pigment or dye. Alternatively, some of the color filters may not include the above-described pigment or dye, and may include scattering particles such as titanium oxide.

In another embodiment, the optical functional layer OFL may include a destructive interference structure. The destructive interference structure may include a first reflective layer and a second reflective layer that are arranged on different layers, respectively. First reflected light and second reflected light, which are respectively reflected from the first reflective layer and the second reflective layer, may destructively interfere with each other. Thus, the reflectivity of external light may be reduced or minimized.

The cover window 20 may be arranged on the display panel 10. The cover window 20 may protect the display panel 10. In an embodiment, the cover window 20 may be a flexible window. The cover window 20 may protect the display panel 10 by being easily bent according to the external force without damage such as a crack and the like. The cover window 20 may include at least one of glass, sapphire, and plastic. The cover window 20 may include, for example, ultra thin glass (UTG) or colorless polyimide (CPI). In an embodiment, the cover window 20 may have a structure in which a flexible polymer layer is arranged on one surface of a glass substrate, or may include a polymer layer only.

The cover window 20 may be attached to the display panel 10 via an adhesive member. The adhesive member AD may be a transparent adhesive member such as an optically clear adhesive (OCA) film. In addition, the adhesive member AD may include various adhesive materials. The adhesive member AD may be formed on an upper portion of the display panel 10 by various methods. For example, the adhesive member AD may be formed on the upper portion of the display panel 10 in the form of a film. For example, the adhesive member AD may be attached to an upper portion of the display panel 10, for example, an upper portion of the thin film encapsulation layer TFE, in the form of a material coated to the upper portion of the display panel 10.

The display driving unit 30 may be arranged in the pad area PDA. The display driving unit 30 may receive control signals and power voltages, and generate and output signals and voltages for driving the display panel 10. The display driving unit 30 may include an integrated circuit (IC).

The display circuit board 40 may be electrically connected to the display panel 10. For example, the display circuit board 40 may be electrically connected to the pad area PDA of the substrate 100 via an anisotropic conductive film.

The display circuit board 40 may include a flexible printed circuit board (FPCB), which is flexible, or a rigid printed circuit board (PCB), which is rigid so as not to be easily bent. Alternatively, the display circuit board 40 may include a composite printed circuit board that includes both of the rigid printed circuit board and the flexible printed circuit board.

The touch sensor driving unit 50 may be arranged on the display circuit board 40. The touch sensor driving unit 50 may include an integrated circuit (IC). The touch sensor driving unit 50 may be attached to the display circuit board 40. The touch sensor driving unit 50 may be electrically connected to the sensor electrodes of the touch sensor layer TSL of the display panel 10 via the display circuit board 40.

In addition, a power supply unit may be further arranged on the display circuit board 40. The power supply unit may supply a driving voltage for driving the pixels of the display panel 10 and the display driving unit 30.

The protective film PTF may be patterned and attached to the lower surface (e.g., a rear surface) 100LS of the substrate 100. For example, the protective film PTF may be attached to a portion of the substrate 100 except the bending area BA. For example, the display layer DSL may be disposed at an upper surface (e.g., a front surface) 100US of the substrate 100. For example, a first portion of the protective film PTF may be disposed in a first area A1 of the substrate 100, and a second portion of the protective film PTF may be disposed in a second area A2 of the substrate 100 corresponding to the pad area PDA. For example, the first and second portions of the protective film PTF may face each other with the cushion layer 60 therebetween.

In an embodiment, the cushion layer 60 may be arranged between the protective films PTF. The cushion layer 60 may prevent damage of the display panel 10 by absorbing external impact. The cushion layer 60 may include polymer resin such as polyurethane, polycarbonate, polypropylene, polyethylene, and the like, or an elastic material such as rubber, sponge obtained by foam molding a urethane-based material or an acrylic material, and the like.

Figure 3:
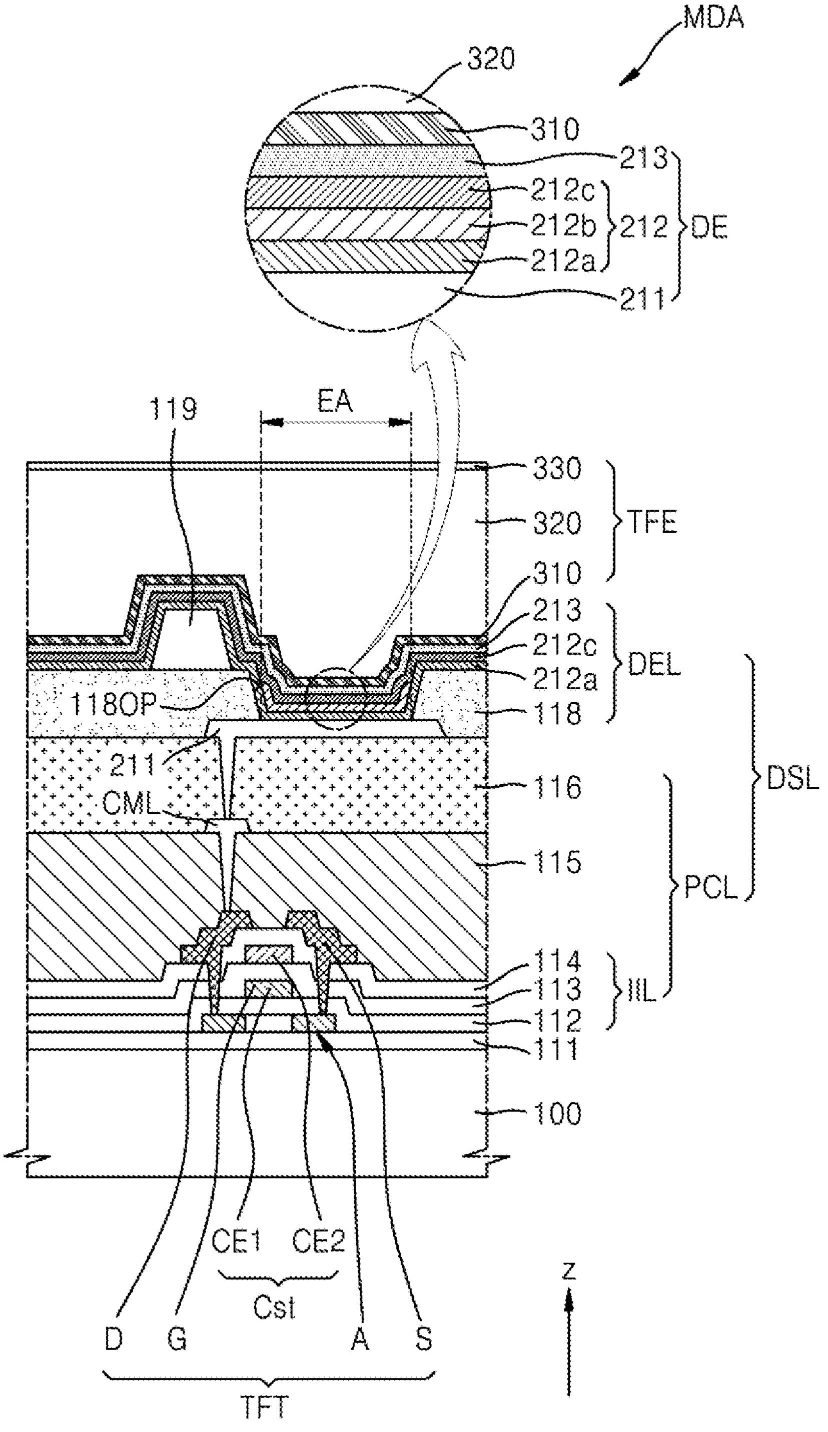
FIG. 3 is a schematic cross-sectional view taken along line A-A' of FIG. 1.

FIG. 3 is a schematic cross-sectional view of the display panel of FIG. 1 taken along line A-A'.

Referring to FIG. 3, the display panel 10 may include the substrate 100, the display layer DSL, the thin film encapsulation layer TFE, and the touch sensor layer TSL. The substrate 100 may include the display area DA and the peripheral area PA.

The display layer DSL may be arranged in the display area DA. The display layer DSL may include an inorganic insulating layer IIL, a pixel circuit layer PCL, a first planarization layer 115, a second planarization layer 116, and an organic light-emitting diode (OLED). The inorganic insulating layer IIL may include a buffer layer 111, a first gate insulating layer 112, a second gate insulating layer 113, and an interlayer insulating layer 114. The pixel circuit layer PCL may include a thin film transistor TFT and a storage capacitor Cst.

The buffer layer 111 may be arranged on the substrate 100. The buffer layer 111 may include an inorganic insulating material such as silicon nitride (SiNx), silicon oxynitride (SiOxNy), and silicon oxide (SiO2), and may be a single layer or multilayer including the above-described inorganic insulating material.

A pixel circuit layer PCL may be arranged on the buffer layer 111. The pixel circuit layer PCL may include the thin film transistor TFT included in the pixel circuit PC, and the inorganic insulating layer IIL, the first planarization layer 115, and the second planarization layer 116 arranged below or/and above constituent elements of the thin film transistor TFT. The inorganic insulating layer IIL may include the first gate insulating layer 112, the second gate insulating layer 113, and the interlayer insulating layer 114.

The thin film transistor TFT may include a semiconductor layer A, and the semiconductor layer A may include polysilicon. Alternatively, the semiconductor layer A may include amorphous silicon, oxide semiconductor, organic semiconductor, and the like. The semiconductor layer A may include a channel region, and a drain region and a source region arranged at both sides of the channel region. A gate electrode G may overlap the channel region.

The gate electrode G may include a low-resistance metal material. The gate electrode G may include a conductive material including molybdenum (Mo), aluminum (Al), copper (Cu), titanium (Ti), and the like, and may be formed in a multilayer or single layer including the above-described material.

The first gate insulating layer 112 between the semiconductor layer A and the gate electrode G may include an inorganic insulating material such as SiO2, SiNx, SiOxNy, Al2O3, TiO2, Ta2O5, hafnium oxide (HfO2), zinc oxide (ZnO2), and the like.

The second gate insulating layer 113 may cover the gate electrode G. The second gate insulating layer 113 may include an inorganic insulating material such as $SiO_2$, SiNx, SiOxNy, Al2O3, TiO2, Ta2O5, HfO2, ZnO2, and the like, in a similar manner to the first gate insulating layer 112.

An upper electrode CE2 of the storage capacitor Cst may be arranged above the second gate insulating layer 113. The upper electrode CE2 may overlap the gate electrode G thereunder. For example, the gate electrode G and the upper electrode CE2, which overlap each other with the second gate insulating layer 113 therebetween, may form the storage capacitor Cst of the pixel circuit PC. In other words, the gate electrode G may function as a lower electrode CE1 of the storage capacitor Cst. As such, the storage capacitor Cst and the thin film transistor TFT may overlap each other. In some embodiments, the storage capacitor Cst may be formed not to overlap the thin film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer including the above-described material.

The interlayer insulating layer 114 may cover the upper electrode CE2. The interlayer insulating layer 114 may include SiO2, SiNx, SiOxNy, Al2O3, TiO2, Ta2O5, HfO2, or ZnO2, and the like. The interlayer insulating layer 114 may be a single layer or multilayer including the above-described inorganic insulating material.

A drain electrode D and a source electrode S may each be located on the interlayer insulating layer 114. The drain electrode D and the source electrode S may each include a material having excellent conductivity. The drain electrode D and the source electrode S may each include a conductive material including Mo, Al, Cu, Ti, and the like, and may be formed in a single layer or multilayer including the above-described material. In an embodiment, the drain electrode D and the source electrode S may have a multilayer structure of Ti/Al/Ti.

The first planarization layer 115 may cover the drain electrode D and the source electrode S. The first planarization layer 115 may include an organic insulating layer. The first planarization layer 115 may include an organic insulating material, for example, general purpose polymer such as polymethylmethacrylate (PMMA) or polystyrene (PS), polymer derivatives having a phenolic group, acrylic polymer, imide-based polymer, aryl ether-based polymer, amide-based polymer, fluorine-based polymer, p-xylene-based polymer, vinyl alcohol-based polymer, and blends thereof.

A connection electrode CML may be arranged on the first planarization layer 115. For example, the connection electrode CML may be connected to the drain electrode D or the source electrode S via a contact hole of the first planarization layer 115. The connection electrode CML may include a material having excellent conductivity. The connection electrode CML may include a conductive material including Mo, Al, Cu, Ti, and the like, and may be formed in a single layer or multilayer including the above-described material. In an embodiment, the connection electrode CML may have a multilayer structure of Ti/Al/Ti.

The second planarization layer 116 may cover the connection electrode CML. The second planarization layer 116 may include an organic insulating layer. The second planarization layer 116 may include an organic insulating material, for example, general purpose polymer such as polymethylmethacrylate (PMMA) or polystyrene (PS), polymer derivatives having a phenolic group, acrylic polymer, imide-based polymer, aryl ether-based polymer, amide-based polymer, fluorine-based polymer, p-xylene-based polymer, vinyl alcohol-based polymer, and blends thereof.

The display layer DSL may include a display element layer DEL and the pixel circuit layer PCL. For example, the display element layer DEL may be arranged on the pixel circuit layer PCL. The display element layer DEL may include a display element DE. The display element DE may be the organic light-emitting diode OLED. A pixel electrode 211 of the display element DE may be electrically connected to the connection electrode CML via a contact hole of the second planarization layer 116.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflective film including Ag, Mg, Al, Pt, Pd, Au, Ni, Nd, Ir, Cr, or compounds thereof. In another embodiment, the pixel electrode 211 may further include a layer including ITO, IZO, ZnO, or $In_2O_3$ above/below the above-described reflective film.

A pixel defining layer 118 having an opening 1180P for exposing the center portion of the pixel electrode 211 may be arranged on the pixel electrode 211. The pixel defining layer 118 may include an organic insulating material and/or an inorganic insulating material. The opening 1180P may define an emission area of light emitted from the display element DE (hereinafter, referred to as the emission area EA). For example, the width of the opening 1180P may correspond to the width of the emission area EA of the display element DE.

A spacer 119 may be arranged on the pixel defining layer 118. The spacer 119 may prevent damage of the substrate 100 in a method of manufacturing a display device. A mask sheet may be used in a manufacturing process of a display panel. For example, as the mask sheet enters the opening 1180P of the pixel defining layer 118 or is in close contact with the pixel defining layer 118, during the deposition of a deposition material on the substrate 100, the spacer 119 may prevent a portion of the substrate 100 from being damaged or broken by the mask sheet.

The spacer 119 may include an organic insulating material such as polyimide. Alternatively, the spacer 119 may include an inorganic insulating material such as silicon nitride ($SiN_x$) or silicon oxide ($SiO_2$), or an organic insulating material and an inorganic insulating material.

In an embodiment, the spacer 119 may include a material different from the material of the pixel defining layer 118. Alternatively, in another embodiment, the spacer 119 may include the same material as the material of the pixel defining layer 118. In this case, the pixel defining layer 118 and the spacer 119 may be formed together in a mask process using a half-tone mask and the like.

An intermediate layer 212 may be arranged on the pixel defining layer 118. The intermediate layer 212 may include a light-emitting layer 212*b* arranged in the opening 1180P of the pixel defining layer 118. The light-emitting layer 212*b* may include a polymer or a low molecular weight organic material for emitting light of a certain color, e.g., red, green, blue, and white.

A first functional layer 212*a* and a second functional layer 212*c* may be arranged below and above the light-emitting layer 212*b*, respectively. The first functional layer 212*a* may include, for example, a hole transport layer (HTL) and/or a hole injection layer (HIL). The second functional layer 212*c* may be an optional element as a constituent element arranged on the light-emitting layer 212*b*. The second functional layer 212*c* may include an electron transport layer (ETL) and/or an electron injection layer (EIL). The first functional layer 212*a* and/or the second functional layer 212*c*, like a counter electrode 213 to be described below, may be a common layer that entirely covers the substrate 100.

The counter electrode 213 may include a conductive material having a low work function. For example, the counter electrode 213 may include a semi-transparent layer (or a transparent layer) including Ag, Mg, Al, Pt, Pd, Au, Ni, Nd, Ir, Cr, lithium (Li), Ca, an alloy thereof, and the like. Alternatively, the counter electrode 213 may further include a layer including ITO, IZO, ZnO, or $In_2O_3$ on the semi-transparent layer (or the transparent layer) including the above-described material.

In some embodiments, a capping layer may be further arranged on the counter electrode 213. The capping layer may include LiF, an inorganic material, or/and an organic material.

The thin film encapsulation layer TFE may be arranged on the counter electrode 213. In an embodiment, the thin film encapsulation layer TFE may include at least one inorganic encapsulation layer and at least one organic encapsulation layer, and FIG. 14 illustrates that the thin film encapsulation layer TFE includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may each include one or more inorganic materials among aluminum oxide ($Al_2O_3$), titanium oxide, tantalum oxide ($TiO_2$), hafnium oxide ($HfO_2$), zinc oxide (ZnO), silicon oxide ($SiO_2$), silicon nitride ($SiN_x$), and silicon oxynitride ($SiO_xN_y$). The organic encapsulation layer 320 may include a polymer-based material. The polymer-based material may include acrylic resin, epoxy-based resin, polyimide, polyethylene, and the like. In an embodiment, the organic encapsulation layer 320 may include acrylate.

For example, the touch sensor layer TSL may be arranged on the thin film encapsulation layer TFE, and the optical functional layer OFL may be arranged on touch sensor layer. The touch sensor layer TSL may obtain or sense coordinates information according to an external input, for example, a touch event. The optical functional layer OFL may reduce reflectivity of light (e.g., external light) input from the outside toward the display device 1, and/or may improve color purity of light emitted from the display device 1. In an embodiment, the optical functional layer OFL may include a retarder and/or a polarizer. The retarder may be of a film type or a liquid crystal coating type, and may include a λ/2 retarder and/or a λ/4 retarder. The polarizer may also be of a film type or a liquid crystal coating type. A film type polarizer may include a stretchable synthesis resin film, and a liquid crystal coating type polarizer may include liquid crystals arranged in a certain orientation. Each of the retarder and the polarizer may further include a protective film.

The adhesive member AD may be arranged between the touch sensor layer TSL and the optical functional layer OFL. For example, the adhesive member AD may be formed as various general members that are well-known in the technical field. The adhesive member AD may be a pressure sensitive adhesive (PSA).

Figure 4:
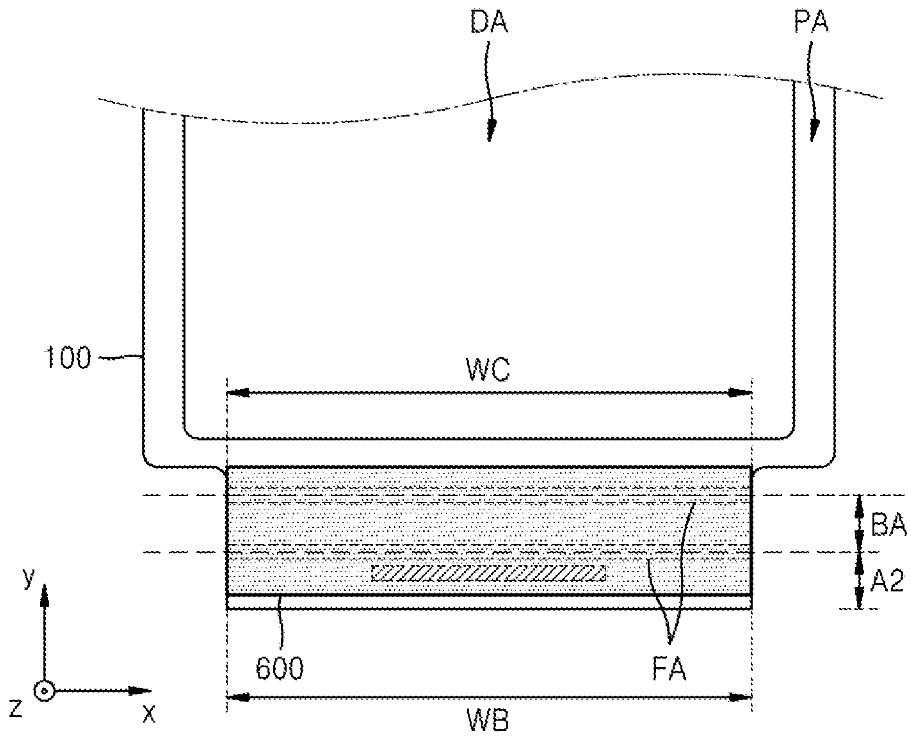
FIG. 4 is an enlarged plan view of a portion of the display device of FIG. 1.

FIG. 4 is an enlarged plan view of a portion of the display device 1 of FIG. 1. For example, FIG. 4 illustrates the portion of the display device 1 in an unbending state.

Referring to FIG. 4, the substrate 100 may include a first area A1 (see FIG. 2), a second area A2, and the bending area BA between the first area A1 and the second area A2. The above-described display layer DSL may be arranged in the first area A1. The above-described display driving unit 30 may be arranged in the second area A2. The bending area BA may be bent between the first area A1 and the second area A2 with respect to a bending axis BAX (see FIG. 2).

A cover member 600 (see FIG. 2) may be arranged in the second area A2. In detail, the cover member 600 may cover not only the display driving unit 30, but also the second area A2, and extend toward the bending area BA to cover the entire surface of the bending area BA. Furthermore, the cover member 600 may extend to cover a portion of the first area A1, for example, a portion of the peripheral area PA in the first area A1. For example, an adhesive layer is disposed between the cover member 600 and the substrate 100 to attach the cover member 600 to the substrate 100. In other words, the cover member 600 may protect not only the display driving unit 30, but also the bending area BA of the substrate 100 by extending from the display driving unit 30, and furthermore, maintain the curvature of the bending area BA of the substrate 100.

In an embodiment, the cover member 600 may cover the bending area BA, and extend to a flat portion of the first area A1 and a flat portion of the second area A2. For example, the cover member 600 may include a first portion 600-1 covering a flat portion of the first area A1, a second portion 600-2 covering the flat portion of the second area A2, and a third portion 600-3 covering the bending area BA. As the cover member 600 is attached to the flat portions of the first area A1 and the second area A2, when the substrate 100 is bent, the bending area BA may be prevented from cracking open or from unbending, thereby maintaining the curvature of the bending area BA.

Figure 6:
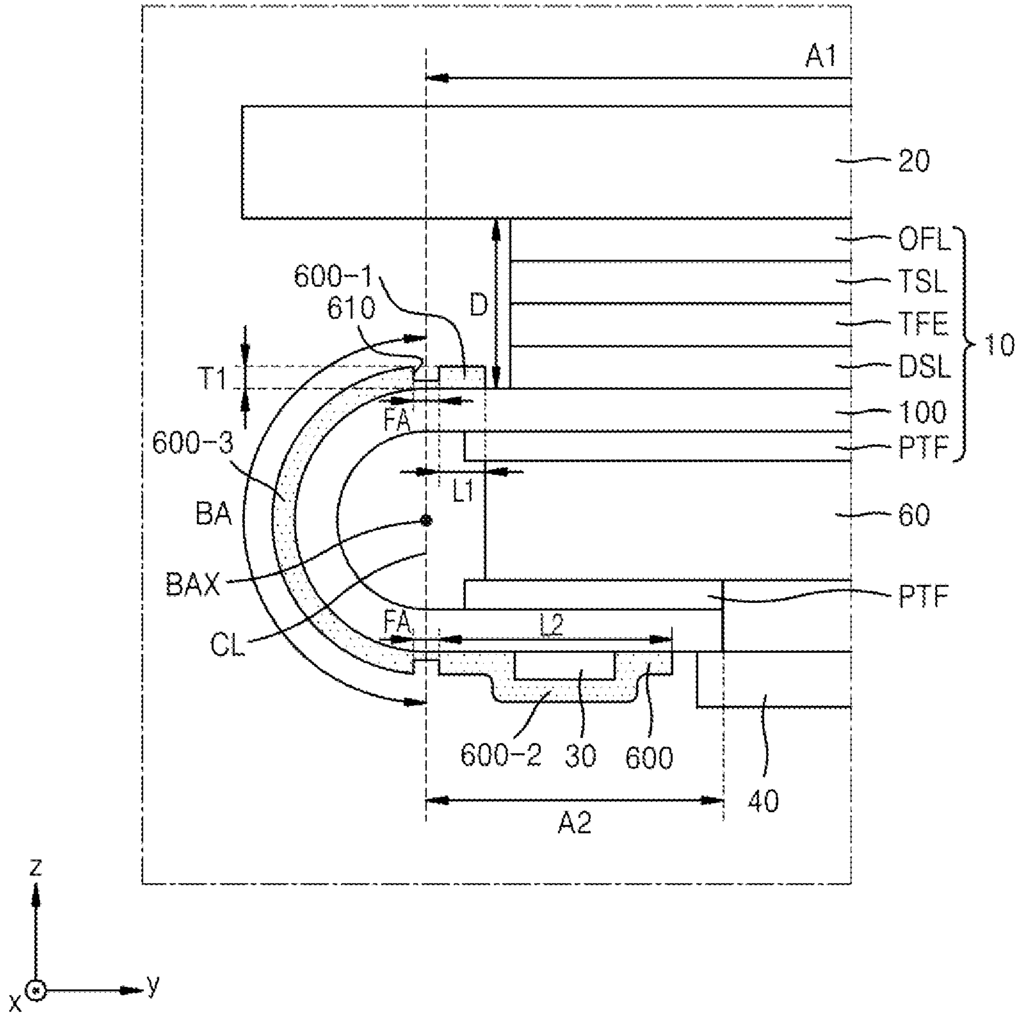
FIG. 6 is an enlarged view of the cover member of FIG. 2 in a bending state.

Furthermore, referring to FIG. 6, the length L2 of the second portion 600-2 of the cover member 600 extending to the second area A2 may be longer than the length L1 of the first portion 600-1 of the cover member 600 extending to the first area A1. For example, the length L1 of the first portion 600-1 of the cover member 600 covering the first area from the bending area is shorter than the length L2 of the second portion 600-2 of the cover member 600 covering the second area from the bending area. The second portion 600-2 of the cover member 600 extending to the second area A2 may cover the display driving unit 30. The first portion 600-1 of the cover member 600 extending to the first area A1 may be arranged apart from the display layer DSL not to interfere with the display layer DSL. For example, the first portion 600-1 of the cover member 600 may be spaced apart from the display layer DSL in the positive/negative y direction. Such a spacing may be clearance tolerance.

In an embodiment, the cover member 600 may include a metal material, e.g., copper (Cu). As the cover member 600 includes a metal material such as copper (Cu), the bending area BA of the substrate 100 may be protected from external impact. Furthermore, the cover member 600 may function as an outer guide to maintain the bending of the substrate 100. In detail, stress may be generated in the substrate 100 in the bending state, and accordingly, the substrate 100 may crack open or unbend again after bending. As the cover member 600 is arranged in the bending area BA of the substrate 100, the stress to the substrate 100 may be reduced, and furthermore, the cover member 600 may function as an outer guide to maintain the bending of the substrate 100.

Furthermore, in an embodiment, the thickness T1 of the cover member 600 may be less than a distance D between one surface of a cover window 20 covering the first area A1 of the substrate 100 and one surface of the first area A1 of the substrate 100 facing the one surface of the cover window 20.

Referring to FIG. 4, in an embodiment, the width WC of the cover member 600 (e.g., the length in the positive x direction of FIG. 4) may be the substantially same as the width WB of the bending area BA. In other words, the cover member 600 may be attached to entirely cover the width WB of the bending area BA. Accordingly, the cover member 600 may entirely protect the bending area BA and support the bending area BA firmly. Alternatively, the cover member 600 may be attached to partially cover the width WB of the bending area BA.

Figure 5:
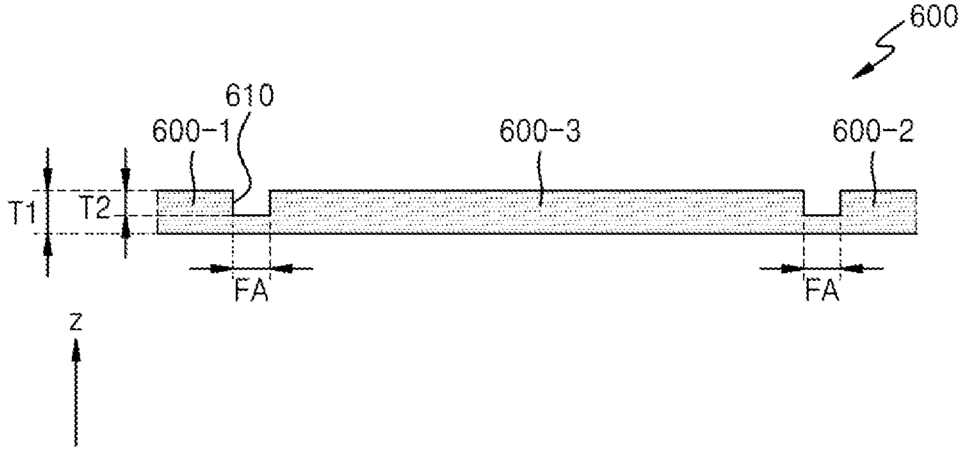
FIG. 5 is a side view of a cover member of FIG. 2 in an unbending state.

FIG. 5 is a side view showing the cover member 600 of FIG. 2 before bending (e.g., in an unbending state). FIG. 6 is an enlarged view showing the cover member 600 of FIG. 2 after bending (e.g., in a bending state).

Referring to FIGS. 5 and 6, the cover member 600 may cover a portion of the second area A2 of the substrate 100, extend to the bending area BA to cover the entire surface of the bending area BA, and further extend to cover a portion of the first area A1. For example, the width WC of the cover member 600 (e.g., the length in the positive x direction of FIGS. 4 and 5) may be the substantially same as the width WB of the bending area BA (e.g., the length in the positive x direction of FIG. 6). In other words, the cover member 600 may not only protect the display driving unit 30 arranged in the second area A2, but also extend therefrom to protect the bending area BA of the substrate 100, and maintain the curvature of the bending area BA of the substrate 100.

In an embodiment, the cover member 600 may include a separation area FA between the first area A1 (or the second area A2) and the bending area BA. For example, the separation area FA may be defined by a recessed portion formed on a first surface (e.g., an outer surface) of the cover member 600 opposite to a second surface (e.g., an inner surface) of the cover member 600 facing the substrate 100. For example, the cover member 600 may be bent when the bending area BA of the substrate 100 is bent. Thus, the separation area FA of the cover member 600 may be spaced out such that the gap of the separation area FA is increased when the cover member 600 is bent along the bending area BA of the substrate 100, thereby facilitating the bending of the cover member 600 or the bending of the substrate 100.

Furthermore, the thickness T2 (e.g., the length in a positive z direction of FIG. 5) of the separation area FA may be less than the other portion of the cover member 600. In the cover member 600, as the thickness T2 of the separation area FA is less than that of the other portion of the cover member 600, the cover member 600 may be easily bent in the separation area FA.

In an embodiment, the separation area FA may include a plurality of separation areas. For example, the separation area FA may include two separation areas FA respectively formed at positions corresponding to both ends of the bending area BA, e.g., end portions in the positive z direction and a negative z direction of FIG. 6. In other words, the bending area BA may have, for example, a cross-section having a semi-circular circumfernce to have a certain curvature, as illustrated in FIG. 6. For example, the cover member 600 may be attached to cover the bending area BA corresponding to the curvature of the bending area BA, and the separation area FA may be arranged at a position corresponding to a position where the curvature of the bending area BA ends. In detail, the position where the curvature of the bending area BA ends may mean a position where an angle between a tangent plane to a position of the bending area BA and one surface of the first area A1, e.g., a surface in the positive z direction of FIG. 6, or one surface of the second area A2, e.g., a surface in the negative z direction of FIG. 6, is 0°.

Accordingly, the cover member 600 may be easily bent at a position where the bending of the substrate 100 ends. The substrate 100 is bent with the cover member 600 so that the curvature of the bending area BA may be maintained within the cover member 600.

Figure 7:
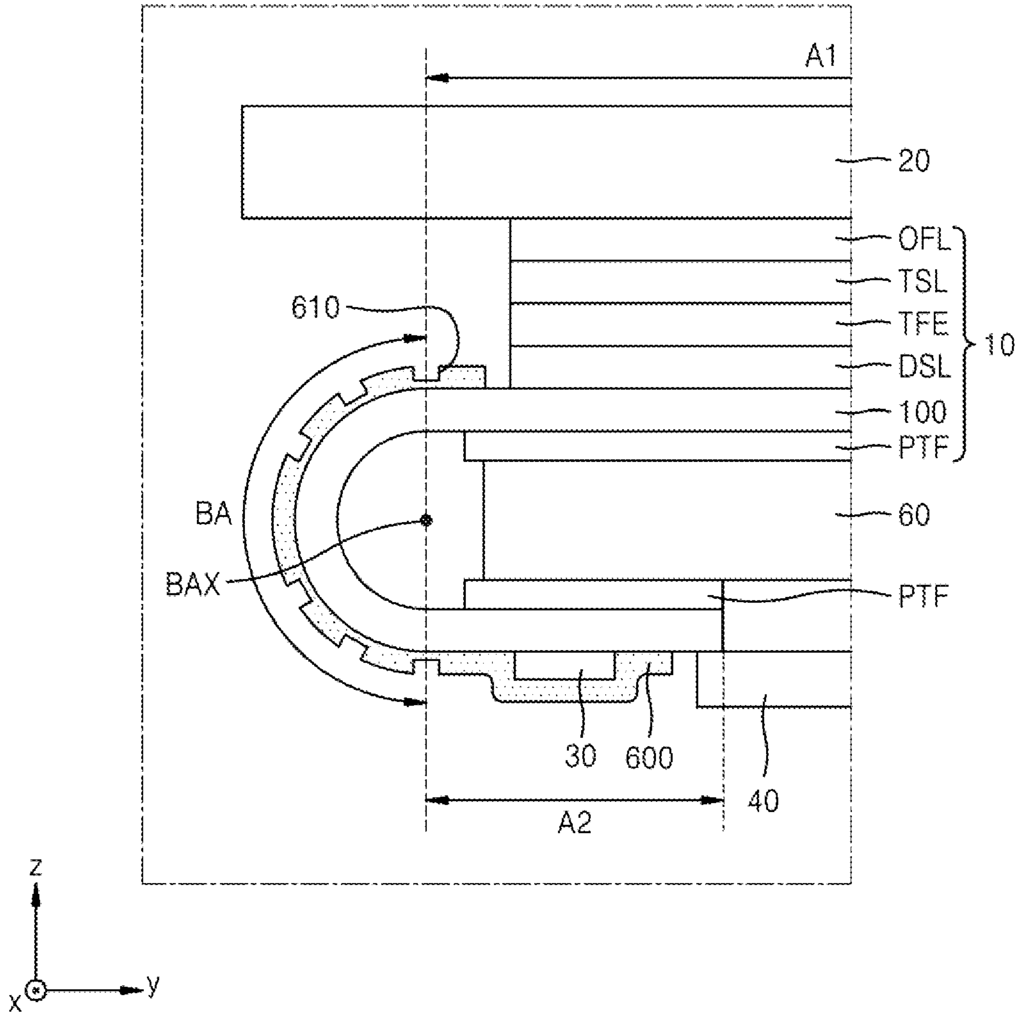
FIG. 7 is a cross-sectional view of another embodiment of the display device of FIG. 1 in a bending state.

FIG. 7 is a cross-sectional view of a cover member according to another embodiment.

Referring to FIG. 7, the separation area FA may be arranged not only at both ends of the bending area BA, but also at a plurality of places along a curved surface of the bending area BA from the first area A1 to the second area A2. For example, a plurality of separation areas FA may be arranged parallel to the first area A1 and symmetrically with respect to a plane passing through the bending axis BAX of the bending area BA. FIG. 7 illustrates that, in an embodiment, there are six separation areas FA. However, embodiments are not limited thereto. For example, the separation area FA may include the different number of separation areas FA.

As such, a plurality of separation areas FA are arranged along the curved surface of the bending area BA. Thus, the cover member 600 may be easily bent. Furthermore, as a plurality of separation areas FA are symmetrically arranged, the cover member 600 may be bent uniformly in one direction, for example, a vertical direction of FIG. 7, and accordingly, the substrate 100 in the cover member 600 may be bent at a uniform curvature.

Referring back to FIGS. 5 and 6, the separation area FA may include a groove 610. In detail, a portion of the cover member 600 may be separated in the separation area FA through the groove 610. The groove 610 may be a groove having a U-shaped cross-section or a rectangular cross-section with respect to a center line CL. For example, the center line CL may extend along the separation area FA and the bending axis BAX. However, embodiments are not limited thereto. In an embodiment, the center line CL of the groove 610 may be parallel to a line perpendicular to one surface of the first area A1, e.g., a surface in the positive z direction of FIG. 6, or one surface of the second area A2, e.g., a surface in the negative z direction of FIG. 6. Furthermore, a line perpendicular to one surface of the first area A1 or one surface of the second area A2 at a position where the curvature of the bending area BA ends may be the substantially same as the center line CL of the groove 610. For example, the groove 610 may continuously extend in the positive/negative x direction. Alternatively, the groove 610 may discontinuously extend in the positive/negative x direction.

Figure 8:
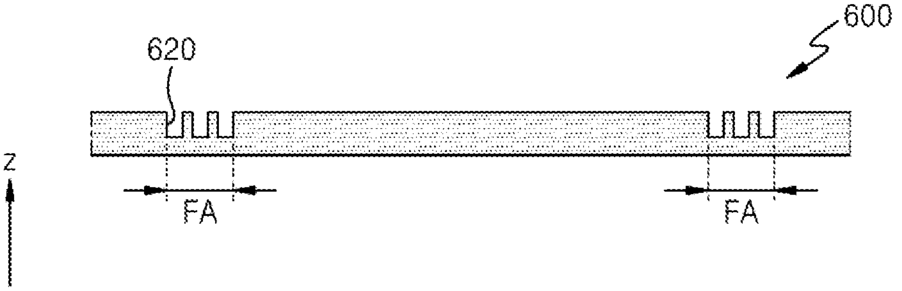
FIG. 8 is a side view of a cover member of the display device of FIG. 7 in an unbending state.
Figure 9:
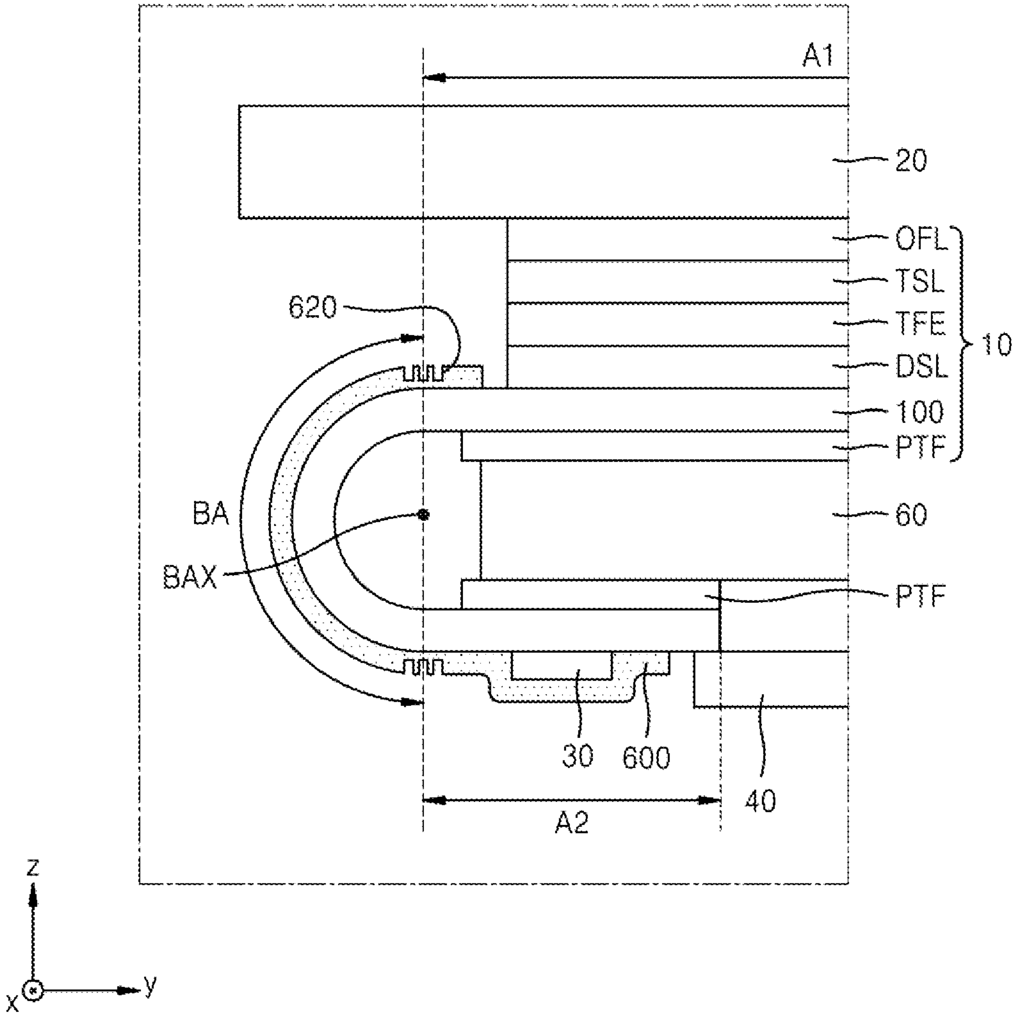
FIG. 9 is a cross-sectional view of another embodiment of the display device of FIG. 1 in a bending state.

FIG. 8 is a side view showing a cover member before bending (e.g., in an unbending state) according to another embodiment. FIG. 9 is a cross-sectional view of the cover member 600 of FIG. 8 in a bending state. In the following description, differences from the above-described embodiment are mainly described.

Referring to FIGS. 8 and 9, the separation area FA of the cover member 600 may include a plurality of uneven portions 620. The uneven portions 620 may be arranged close to each other, and convex portions are separated apart from each other in the bending state of the cover member 600 so that the cover member 600 may be easily bent at a portion to be bent. As illustrated in FIG. 8, each of concave portions of the uneven portions 620 may have the substantially same shape. In an embodiment, the concave portion may be a groove having a U-shaped or rectangular cross-section, like the above-described groove 610, but embodiments are not limited thereto. For example, the concave portion may have various shapes.

Furthermore, the uneven portions 620 may be arranged with respect to a position where the curvature of the bending area BA ends, e.g., a position where the bending area BA is connected to the first area A1 or the second area A2. For example, as illustrated in FIG. 9, the uneven portions 620 may have three concave portions, and the second concave portion of the three concave portions may be located at a position where the curvature of the bending area BA ends. Accordingly, the cover member 600 may be bent to fit to the shape when the substrate 100 is bent, thereby having a shape, and the bending area BA may maintain a state of being bent in the cover member 600, in particular a curvature in the bending state.

Figure 10:
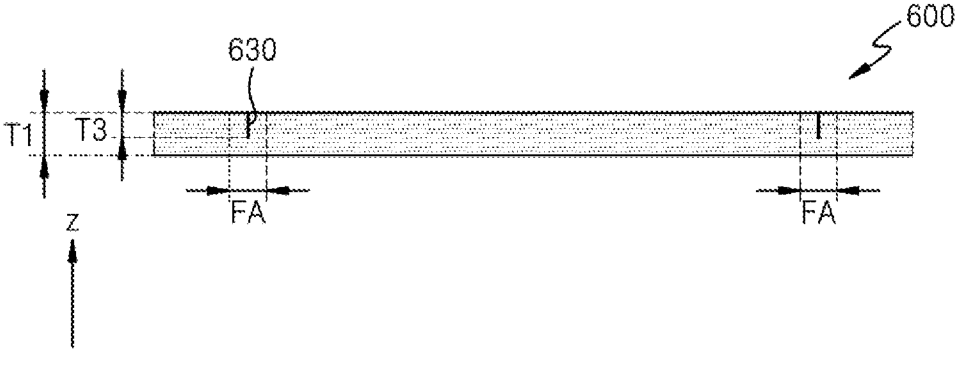
FIG. 10 is a side view of a cover member of the display device of FIG. 9 in an unbending state.
Figure 11:
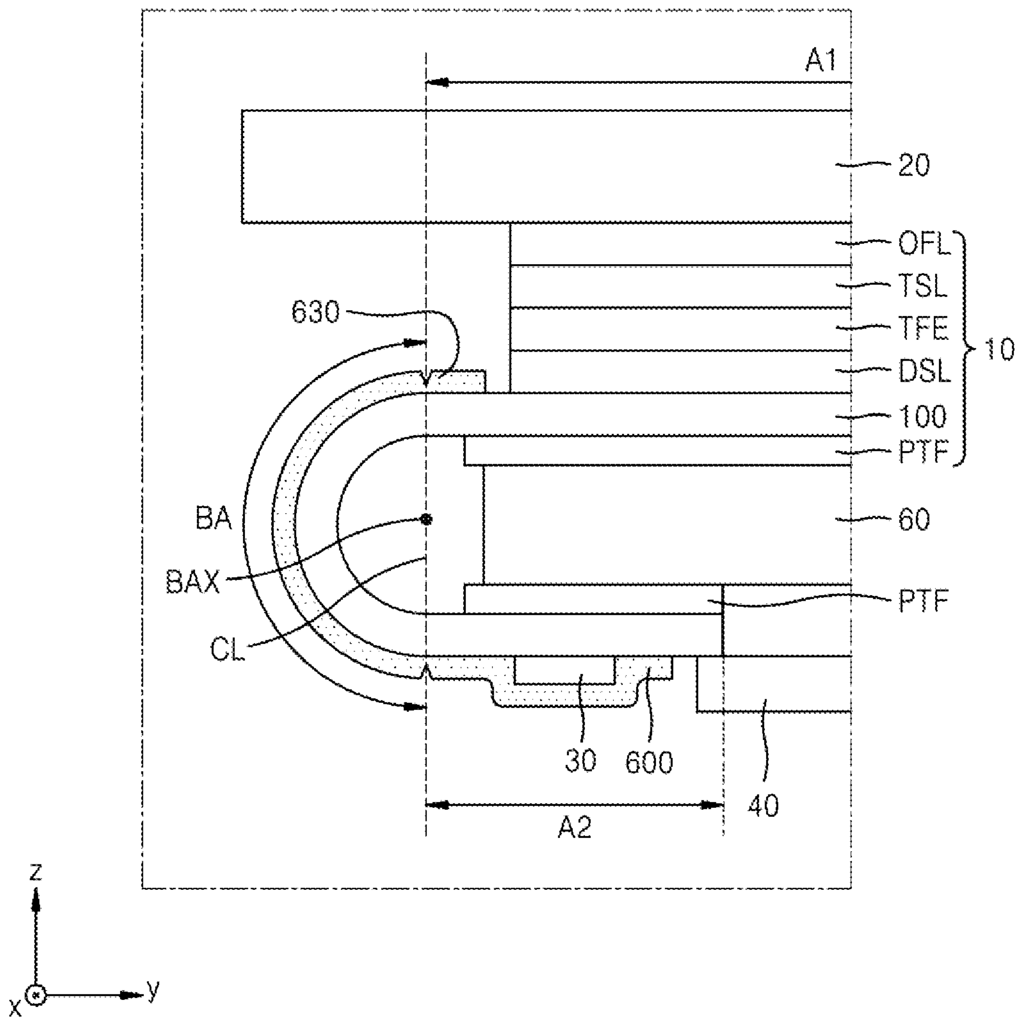
FIG. 11 is a cross-sectional view of another embodiment of the display device of FIG. 1 in a bending state.

FIG. 10 is a side view showing a cover member in an unbending state according to another embodiment. FIG. 11 is a cross-sectional view of the cover member 600 of FIG. 10 in a bending state. In the following description, differences from the above-described embodiments are mainly described.

Referring to FIGS. 10 and 11, a folding area in the form of the separation area FA may include a cut portion 630. In detail, a portion of the cover member 600 may be separated in the separation area FA through the cut portion 630. The cut portion 630 may be obtained by cutting a portion of the cover member 600 in a direction (e.g., a positive z direction of FIG. 10) perpendicular to one surface in a state before the cover member 600 is bent.

Before bending (e.g., in the unbending state) of the cover member 600, the opposite sides facing each other with respect to the cut portion 630 are in contact with each other, as illustrated in FIG. 10, and during bending (e.g., in the unbending state) of the cover member 600, the opposite sides may be separated from each other with respect to the cut portion 630, as illustrated in FIG. 11.

In an embodiment, as illustrated in FIG. 11, in the cover member 600 in a bending state, the center line CL of the cut portion 630 may be parallel to a line perpendicular (e.g., a positive z direction of FIG. 11) to the first area A1 or the second area A2. Furthermore, a line perpendicular to the first area A1 or the second area A2 at a position where the curvature of the bending area BA ends may be the substantially same as the center line CL of the cut portion 630.

In an embodiment, the folding area in the form of the cut portion 630 of the cover member 600 may be formed by cutting half or more of the thickness T3 (e.g., the length in the positive z direction of FIG. 10) of the cover member 600. For example, referring to FIG. 10, the folding area in the form of the cut portion 630 may have the thickness T3 less than the thickness T1 of a main portion of the cover member 600. Accordingly, during bending (e.g., in the unbending state) of the cover member 600, the cover member 600 may be easily folded at the cut portion 630.

Figure 12:
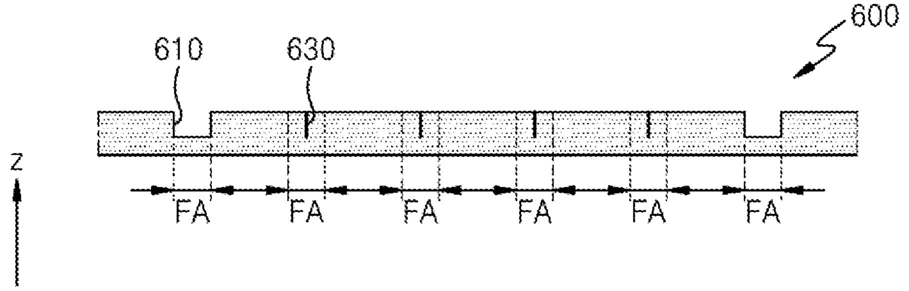
FIG. 12 is a side view of a cover member of the display device of FIG. 11 in an unbending state.
Figure 13:
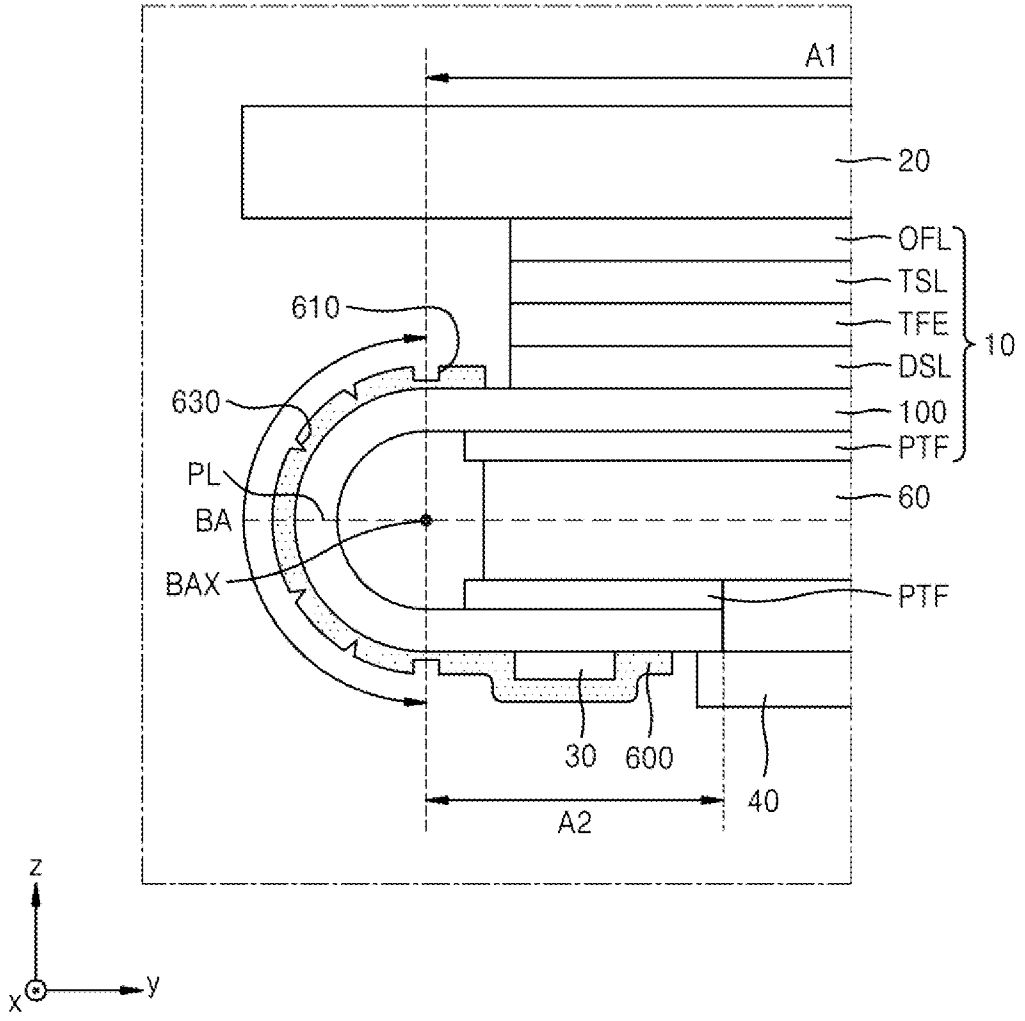
FIG. 13 is a cross-sectional view of another embodiment of the display device of FIG. 1 in a bending state.

FIG. 12 is a side view showing a cover member before bending according to another embodiment. FIG. 13 is a cross-sectional view of the cover member 600 of FIG. 12 in a bending state. In the following description, differences from the above-described embodiments are mainly described for descriptive convenience.

Referring to FIGS. 12 and 13, the separation area FA may include a plurality of separation areas FA. For example, in an embodiment, the groove 610 may be arranged at both positions where the curvature of the bending area BA ends. Furthermore, for example, a plurality of cut portions 630 may be arranged along the curved surface of the bending area BA from the first area A1 to the second area A2. The groove 610 and the cut portion 630 may be arranged parallel to the first area A1 and symmetrically with respect to a plane PL passing through the bending axis BAX of the bending area BA. For example, the plane PL passing through the bending axis BAX may be substantially parallel to one surface of the first area A1 or one surface of the second area A2. As the groove 610 and the cut portion 630 are the same as or similar to those of the above-described embodiments, detailed descriptions thereof are omitted for descriptive convenience.

Accordingly, a portion of the cover member 600 that is attached to the bending area BA may be easily bent with the bending area BA through the cut portion 630. For example, in the bending area BA, a portion connected to a flat portion of the first area A1 or the second area A2 may be easily bent through the groove 610.

Furthermore, similarly to the illustrations of FIGS. 12 and 13, the uneven portions 620 may be arranged at both positions where the curvature of the bending area BA ends, and a plurality of grooves 610 may be arranged along the curved surface of the bending area BA from the first area A1 to the second area A2.

As such, as a display device includes a cover member having a separation area, the bending area BA may be protected and simultaneously the cover member 600 may be folded or bent at a preset position. Accordingly, the bending area BA may maintain a curvature by maintaining a state of being bent in the cover member 600 with the cover member 600.

A display device according to an embodiment may include a cover member that covers at least a portion of a substrate, and protect a bending area of the substrate.

Furthermore, the cover member may function as a guide to maintain a bending curvature of the substrate.

Furthermore, the cover member may include the separation area and may be bent at a position to be bent, and thus the substrate may be bent and maintained at a designed curvature.

The advantages of the embodiments are not limited to the above-described advantages, and other various effects that are not described in the specification may be clearly understood from the following descriptions by one skilled in the art to which the descriptions belong.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:

a substrate comprising a first area, a second area, and a bending area between the first area and the second area;

a display layer disposed on the first area of the substrate;

a display driving unit disposed on the second area of the substrate; and a cover member that comprises a metal material and is spaced apart from the display layer, the cover member comprising a first surface and a second surface and extending to cover a portion of the second area of the substrate, the bending area of the substrate, and a portion of the first area of the substrate such that the cover member comprises a first distal end in the first area as seen in side view and a second distal end in the second area as seen in side view, wherein the cover member comprises a separation area in which the cover member is partially separated on the first surface opposite to the second surface facing the substrate, the separation area comprising a plurality of recessed portions and being spaced apart from the first distal end and the second distal end of the cover member, the separation area having a thickness less than a thickness of the cover member at a center portion of the cover member and at the first and second distal ends of the cover member, wherein the plurality of recessed portions comprise a first recessed portion closest to the display layer and a second recessed portion closest to the display driving unit, wherein each of the first and second recessed portions comprises an inner concave portion, a middle concave portion, and an outer concave portion, wherein the inner concave portion, the middle concave portion, and the outer concave portion of the first recessed portion are aligned with the inner concave portion, the middle concave portion, and the outer concave portion of the second recessed portion in a thickness direction of the substrate when the bending area is in a bent state, and wherein the middle concave portion of the first recessed portion and the middle concave portion of the second recessed portion are vertically aligned with a bending axis of the bending area of the substrate in the thickness direction of the substrate when the bending area is in the bent state.

2. The display device of claim 1, wherein the separation area extends into both the bending area and one of the first area and the second area.

3. The display device of claim 1, wherein the cover member is configured to maintain a curvature of the substrate when the bending area is in the bent state, and the plurality of recessed portions of the separation area are disposed along a curved surface of the bending area from the first area to the second area.

4. The display device of claim 3, wherein the separation area is substantially parallel to the first area of the substrate and is symmetrical with respect to a plane passing through the bending axis of the bending area of the substrate, and wherein the first recessed portion is at a highest level, and the second recessed portion is a lowest level when the bending area is in the bent state.

5. The display device of claim 1, wherein at least one of the plurality of recessed portions of the separation area comprises a groove.

6. The display device of claim 5, wherein a center line of the groove is substantially parallel to a line substantially perpendicular to the first area or the second area.

7. The display device of claim 1, wherein at least one of the plurality of recessed portions of the separation area comprises a cut portion.

8. The display device of claim 1, wherein the cover member covers the display driving unit.

9. The display device of claim 1, wherein the cover member comprises copper.

10. The display device of claim 1, wherein a thickness of the cover member is less than a distance between one surface of a cover window covering the first area and one surface of the first area of the substrate facing the one surface of the cover window.

11. The display device of claim 1, wherein a width of the cover member is same as a width of the bending area.

12. The display device of claim 1, wherein a length of a first portion of the cover member covering the first area from the bending area is shorter than a length of a second portion of the cover member covering the second area from the bending area.

13. The display device of claim 1, wherein the cover member comprises no separation area that overlaps the display driving unit when the substrate is in an unbent state.

14. The display device of claim 1, wherein the second area overlaps the first area in the thickness direction of the substrate when the bending area is in the bent state, and the cover member does not overlap the display layer when the bending area is in an unbent state.

15. The display device of claim 1, further comprising:

a protective film comprising a first portion and a second portion that are attached to a bottom surface of the substrate in the first area and the second area, respectively, while not disposed in the bending area, and a cushion layer between the first portion and the second portion of the protective film, wherein the separation area does not overlap the protective film and the cushion layer in a thickness direction of the substrate, and wherein a center of the cushion layer is horizontally aligned with the bending axis.

16. The display device of claim 1, wherein the first area and the second area are flat in the bent state, wherein the outer concave portion of the first recessed portion is in the first area of the substrate, wherein the outer concave portion of the second recessed portion is in the second area of the substrate, and wherein the inner concave portion of the first recessed portion and the inner concave portion of the second recessed portion are in the bending area of the substrate.

17. A display device comprising:

a substrate comprising a first area, a second area, and a bending area between the first area and the second area;

a display layer disposed on the first area of the substrate;

a display driving unit disposed on the second area of the substrate; and a cover member that comprises a metal material and is spaced apart from the display layer, the cover member extending to cover a portion of the second area of the substrate, the bending area of the substrate, and a portion of the first area of the substrate such that the cover member comprises a first distal end in the first area as seen in side view and a second distal end in the second area as seen in side view, wherein the cover member comprises a folding area, the folding area being spaced apart from the first distal end of the cover member in the first area of the substrate and the second distal end of the cover member in the second area of the substrate as seen in side view, the folding area having a thickness less than a thickness of the cover member at a center portion of the cover member and at the first and second distal ends of the cover member, wherein the cover member comprises a first recessed portion closest to the display layer and a second recessed portion closest to the display driving unit, wherein each of the first and second recessed portions comprises an inner concave portion, a middle concave portion, and an outer concave portion, wherein the inner concave portion, the middle concave portion, and the outer concave portion of the first recessed portion are aligned with the inner concave portion, the middle concave portion, and the outer concave portion of the second recessed portion in a thickness direction of the substrate when the bending area is in a bent state, and wherein the middle concave portion of the first recessed portion and the middle concave portion of the second recessed portion are vertically aligned with a bending axis of the bending area of the substrate in the thickness direction of the substrate in the thickness direction of the substrate when the bending area is in the bent state.

18. The display device of claim 17, wherein the first recessed portion extends into the bending area and the first area, and wherein the second recessed portion extends into the bending area and the second area.

19. The display device of claim 17, wherein the folding area comprises a plurality of folding areas disposed along a curved surface of the bending area from the first area to the second area.

20. The display device of claim 17, wherein the folding area comprises a cut portion.

* * * * *